United States Patent [19]
Ogawa

[11] Patent Number: 4,733,376
[45] Date of Patent: Mar. 22, 1988

[54] SEMICONDUCTOR MEMORY DEVICE HAVING SERIAL DATA INPUT CIRCUIT AND SERIAL DATA OUTPUT CIRCUIT

[75] Inventor: Junji Ogawa, Tokyo, Japan
[73] Assignee: Fujitsu Limited, Kawasaki, Japan
[21] Appl. No.: 787,044
[22] Filed: Oct. 15, 1985
[30] Foreign Application Priority Data Oct. 17, 1984 [JP] Japan .............................. 59-216057
Oct. 19, 1984 [JP] Japan .............................. 59-218706

[51] Int. Cl.$^4$ .............................................. G11C 7/00
[52] U.S. Cl. ...................................... 365/221; 365/78; 365/240; 340/800
[58] Field of Search ............... 365/221, 230, 233, 219, 365/220, 239, 240; 340/750, 799, 800, 802

[56] References Cited

U.S. PATENT DOCUMENTS

| | | | |
|---|---|---|---|
| 4,060,801 | 11/1977 | Stein et al. | 340/800 |
| 4,149,195 | 4/1979 | Hartke | 340/750 |
| 4,412,313 | 10/1983 | Ackland et al. | 365/240 |
| 4,591,075 | 9/1985 | Dill et al. | 365/219 |
| 4,616,343 | 10/1986 | Ogawa | 365/219 |

Primary Examiner—Stuart N. Hecker
Assistant Examiner—Glenn A. Gossage
Attorney, Agent, or Firm—Staas & Halsey

[57] ABSTRACT

A semiconductor memory device including a memory cell array 1, a serial data input circuit for high-speed, large data store in memory cells and a serial data output circuit for high-speed, large data read-out from the memory cells. The serial data input circuit includes a plurality of shift registers 15, for consecutively storing serial input data $S_{IN}$ applied from an external circuit, and a plurality of first gates 14, for operatively and simultaneously connnecting the shift registers and a plurality of bit lines BL of the memory cell array to store simultaneously the serial input data stored in the shift registers into desired memory cells selected by a desired word line. The serial data output circuit includes a plurality of second gates 12 operatively connected to the bit lines, a plurality of data holding circuits 7, an input of each being operatively connectable to the corresponding bit line through the corresponding one of the second gates, a plurality of third gates provided between outputs of the data holding circuits and data bus(es) 26 and for outputting data held in the data holding circuits to the data bus(es), and a data output circuit 9, 10 having a gate driving circuit for selectively driving one of the third gates. The second gates are simultaneously operated to transfer a plurality of data on a selected word line into the data holding circuit set, and the data held in the holding circuits are output to the data bus(es) in response to the operation of the third gates. The semiconductor memory device is operable for high-speed, large data first-in and first-out.

15 Claims, 27 Drawing Figures

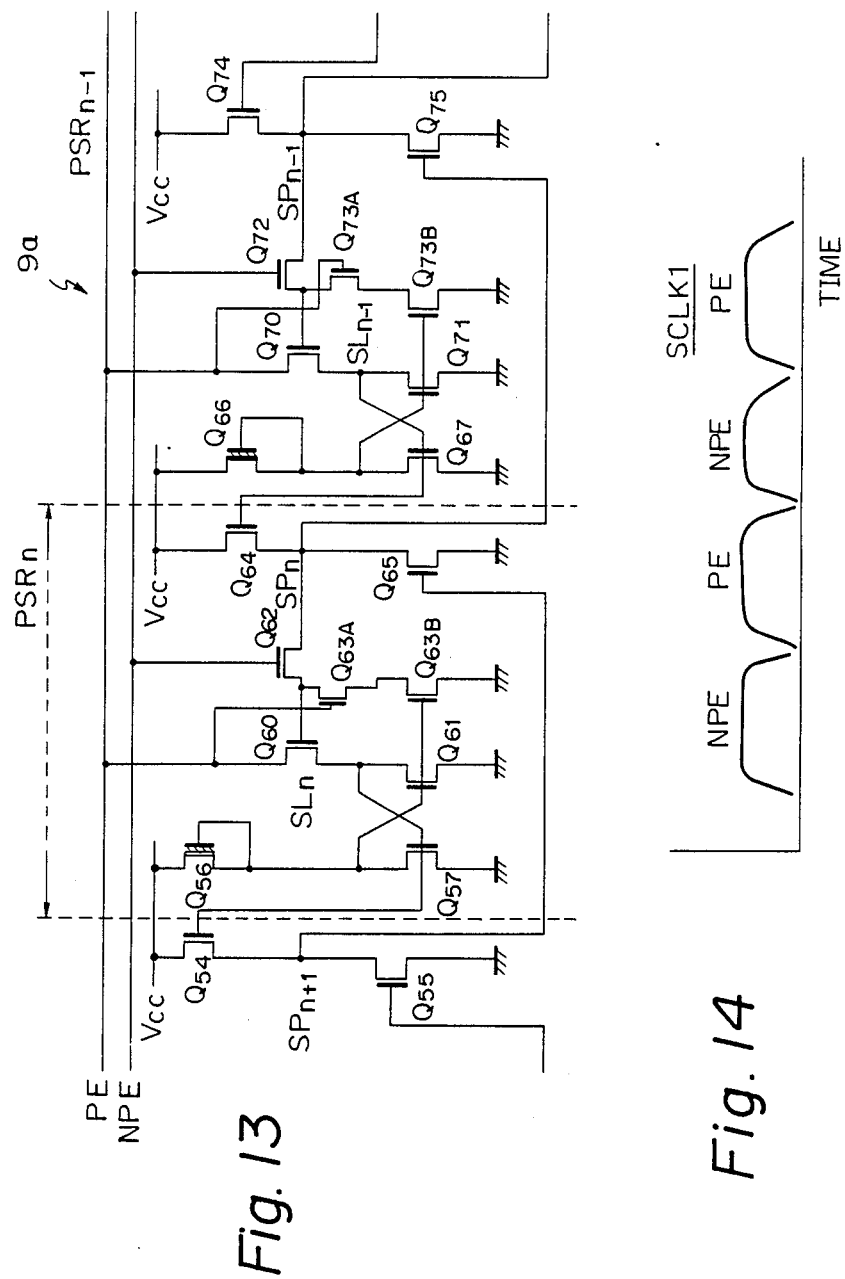

Fig. 15a
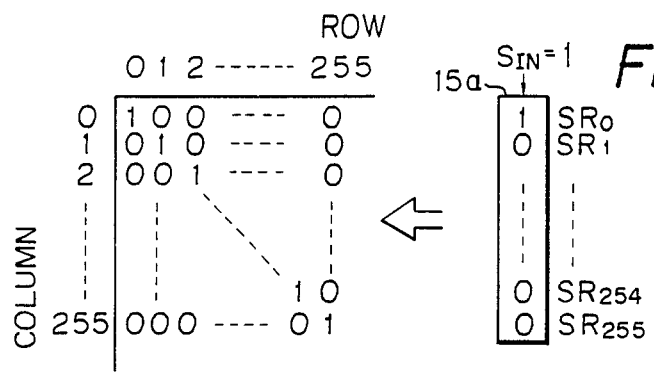
Fig. 15b
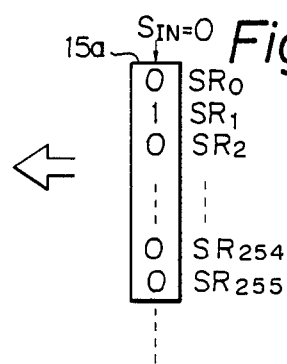
Fig. 15c
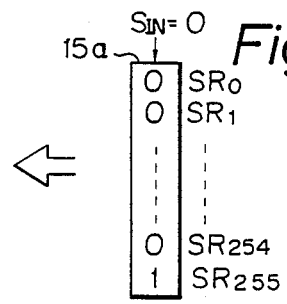
Fig. 15d

Fig. 16a
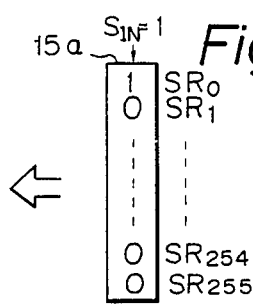
Fig. 16b
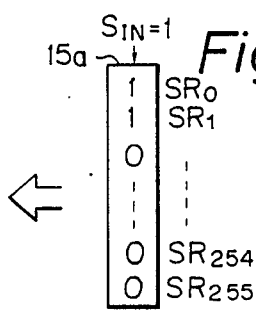
Fig. 16c
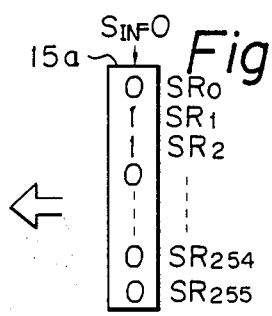
Fig. 16d
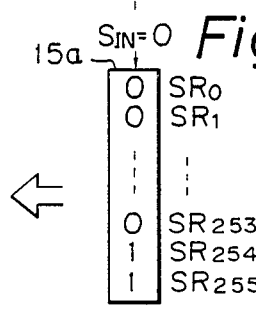
Fig. 16e

SEMICONDUCTOR MEMORY DEVICE HAVING SERIAL DATA INPUT CIRCUIT AND SERIAL DATA OUTPUT CIRCUIT

BACKGROUND OF THE INVENTION

1. Field of the Invention

The present invention relates to a semiconductor memory device, more particularly to a semiconductor memory device having a serial data input circuit and a serial data output circuit. It also relates to a semiconductor memory device operable at high-speed using data in a first-in first-out (FIFO) mode.

2. Description of the Related Art

An image data processing system or the like requires a large capacity memory. To meet the requirement for a large capacity memory at low cost, a dynamic random-access memory (RAM) is extensively used. In addition, in order to display a large amount of image data on a cathode ray tube (CRT) display unit and to compute a large amount of image data, such as gradients and in filtering, high-speed data store and/or read-out are also required. A normal semiconductor memory device having a dynamic RAM, however, suffers from a disadvantage of low-speed data store and/or read-out.

In order to overcome the above disadvantage, there are known in the prior art, semiconductor memory devices including one or more shift register sets provided outside the dynamic RAM, as described in detail later. A shift register set is used for data store into and-/or data read-out from the dynamic RAM of a group of data, e.g., 256 bits, shortening the data store and/or data read-out time.

These prior art semiconductor memory devices, however, still suffer from the disadvantages of low speed, or high power consumption when improving the operation speed, and occupation of a considerably large space on the semiconductor chip, which means low integration density.

Furthermore, a data FIFO system using a register is known. This system, however, suffers from the disadvantage of low amount of data handling capability. On the contrary, a data FIFO system for performing group data accessing of the memory cells is also known. The latter suffers from the disadvantage of low processing speed.

SUMMARY OF THE INVENTION

It is an object of the present invention to provide a semiconductor memory device with low-cost, large-capacity memory cells; improved high-speed, large data store in and/or read-out from the memory cells; low power consumption; and high integration density.

It is another object of the present invention to provide a semiconductor memory device with high-speed data store and/or read-out circuits occupying a reduced area.

It is still another object of the present invention to provide a semiconductor memory device operable using a high-speed on large amounts of FIFO data.

According to the present invention, there is provided a semiconductor memory device including: a memory cell array including a plurality of memory cells arranged in a matrix having a plurality of bit lines, a plurality of word lines, a serial data input circuit and a serial data output circuit. The serial data input circuit, operatively connected to the memory cell array, includes one or more shift register sets, each having a plurality of shift registers consecutively storing serial input data applied from an external circuit, and one or more first gate sets, each having a plurality of gates for operatively and simultaneously connecting the plurality of shift registers of the shift register set and the plurality of bit lines. The connection simultaneously stores the serial input data stored in the plurality of shift registers into desired memory cells in the memory cell array selected by a desired word line. The serial data output circuit, operatively connected to the memory cell array, includes one or more second gate sets, each having a plurality of gates operatively connected to the plurality of bit lines, one or more data holding circuit sets, each having a plurality of data holding circuits, an input of each of which is operatively connectable to the corresponding bit line through the corresponding one of the second gate sets, and one or more third gate sets, each having a plurality of gates provided between outputs of the plurality of data holding circuits and one or more data buses and for outputting data held in the data holding circuits to the data buses. The serial data output circuit also includes a data output circuit having a gate driving circuit for selectively driving one of the gates in the third gate set. The plurality of gates of the second gate set are simultaneously operated to transfer a plurality of data on a selected word line into the data holding circuit set. The data held in the holding circuit set is output to the data bus(es) in response to the operation of the third gate set.

Preferably, the data buses include l data bus lines, "l" being a positive integer number and a power of 2. The gate driving circuit includes j/l shift registers, "j" being the integer number of the bit lines.

The semiconductor memory device may further include a circuit for counting the number of inputs of the serial input data input into the shift register set and outputting the counted value to the data output circuit. The gate driving circuit drives one of the gates in the third gate set in response to output the counted value to read-out data, from first to last, stored in the memory cells through the shift register set.

Preferably, the semiconductor memory device may further include a circuit for recording the sequence of selected word lines during the data store operation from the serial data input circuit and selecting the word line in response to the sequence of selected word line during the data read operation by the serial data output circuit. The counting circuit counts the input number during the data store operation and outputs the counted value to the data output circuit. The gate driving circuit performs the driving in response to each of the word line selections of the word line record and selection circuit.

BRIEF DESCRIPTION OF THE DRAWINGS

Other objects and features of the present invention will be described below in detail with reference to the accompanying drawings, in which:

FIG. 13 is a circuit diagram of a part of the pointer shift register set shown in FIG. 3;

FIG. 14 is a view of waveforms of the clock signal for driving the pointer shift register set shown in FIG. 13;

FIGS. 15a to 15d are views for illustrating data set in the dynamic RAM cell array shown in FIG. 3;

FIGS. 16a to 16e are other views for representing other data sets in the dynamic RAM cell array shown in FIG. 3;

DESCRIPTION OF THE PREFERRED EMBODIMENTS

Before describing preferred embodiments of the present invention, an explanation will be given of the prior art for reference.

Figure 1:
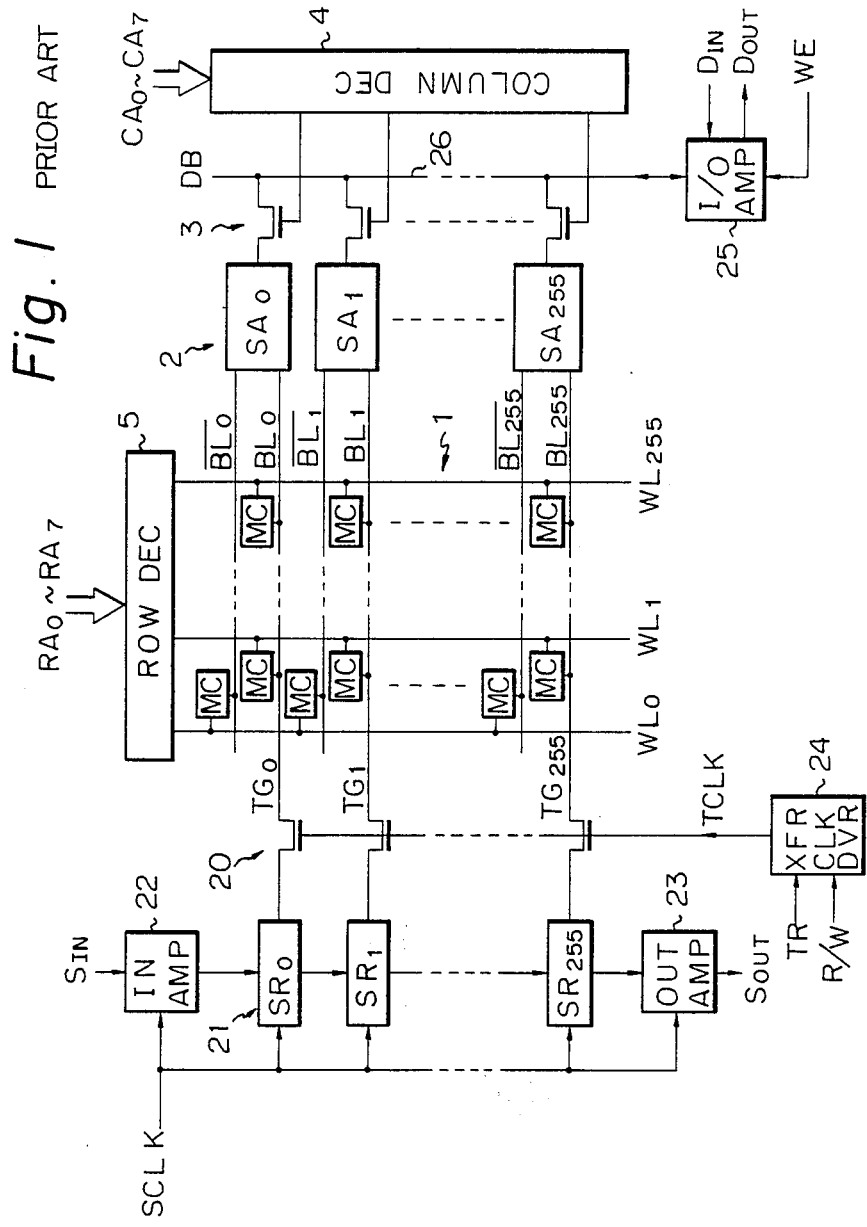
FIG. 1 is a circuit diagram of a prior art semiconductor memory device.

FIG. 1 is a circuit diagram of a prior art semiconductor memory device. In FIG. 1, the semiconductor memory device includes a dynamic RAM cell array 1 consisting of a plurality of dynamic memory cells arranged in a matrix, a row decoder 5 selecting word lines $WL_0$ to $WL_{255}$ connected to the memory cell array 1 in response to a row-address signal of bits $RA_0$ to $RA_7$, a sense amplifier set 2 consisting of a plurality of sense amplifiers $SA_0$ to $SA_{255}$ connected to pairs of bit lines $BL_0:\overline{BL_0}$ to $BL_{255}:\overline{BL_{255}}$ connected to the memory cell array 1, a gate set 3 consisting of a plurality of gates connected to outputs of the sense amplifiers $SA_0$ to $SA_{255}$, a column decoder 4 selecting one of the gates in the gate set 3 in response to a column address signal of bits $CA_0$ to $CA_7$, a data bus (DB) 26 connected to the gates of the gate 3, one of which may be selected in accordance with the output of the column decoder 4, and an input/output (I/O) amplifier 25 connected to the data bus 26. The above-mentioned construction is the same as that of an extensively known dynamic RAM device, accordingly, the basic operation thereof is similar. The semiconductor memory device has a capacity of $256 \times 256 = 64$ kbits. The above-mentioned circuits are referred to as the "dynamic RAM side" in the specification.

In FIG. 1, the semiconductor memory device further includes a transfer gate set 20 consisting of a plurality of transfer gates $TG_0$ to $TG_{255}$ connected to the bit lines $BL_0$ to $BL_{255}$, a shift register set 21 consisting of a plurality of shift registers $SR_0$ to $SR_{255}$ connected to the transfer gates $TG_0$ to $TG_{255}$, an input amplifier 22 provided on an input side of the shift register set 21, and an output amplifier 23 provided on an output side of the shift register set 21. All of the transfer gates $TG_0$ to $TG_{255}$ of the transfer gate set 20 are driven by a transfer clock signal TCLK output from a transfer clock driver 24, which signal is generated in accordance with a transfer request TR and a read or write command R/W applied to the transfer clock driver 24. The latter circuits are referred to as the "shift register side" in the specification.

The operation of the semiconductor memory device shown in FIG. 1 will now be described. The dynamic RAM side and the shift register side are independently operable in a normal state. When the dynamic RAM side is not in operation, all of the transfer gates $TG_0$ to $TG_{255}$ are turned ON in response to the transfer clock signal TCLK to connect the respective shift registers $SR_0$ to $SR_{255}$ to the corresponding bit lines $BL_0$ to $BL_{255}$. Accordingly, when the access mode is a write mode (W/R=1), values stored in the 256 shift registers $SR_0$ to $SR_{255}$ are stored as a group in those memory cells in the memory cell array 1 decided upon by a selected word line. When the access mode is a read mode (W/R=0), values stored in the 256 memory cells in the memory cell array 1 decided by a selected word line are read out, also as a group to the shift registers $SR_0$ to $SR_{255}$.

As the shift register side and the dynamic RAM side are operable asynchronously, 256 bits of data may be input or output by the shift registers concurrently with a random access operation. The shift register side enables an improved serial access operation with approximately ten times the random access speed of the dynamic RAM side. It enables high-speed serial data output from the dynamic RAM cell array 1 storing, for example, image information to a CRT display unit, by transferring the image information for all word lines WL in a group, or high-speed serial data store from the CPU or I/O units to the dynamic RAM cell array 1.

Faster serial access operation of the shift registers is required for high-speed image information processing. One means of achieving this may be to increase the power supplied to the shift register side in the semiconductor memory device shown in FIG. 1. However, there are limits to this due to the requirements of the semiconductor memory device design. That is, considerable power is consumed on the dynamic RAM side. Accordingly, the power which can be increased on the shift register side for improving the serial access speed is limited. In addition, despite the increase in power supplied to the shift register side, the serial access speed cannot be proportionally improved, over a predetermined access speed.

Figure 2:
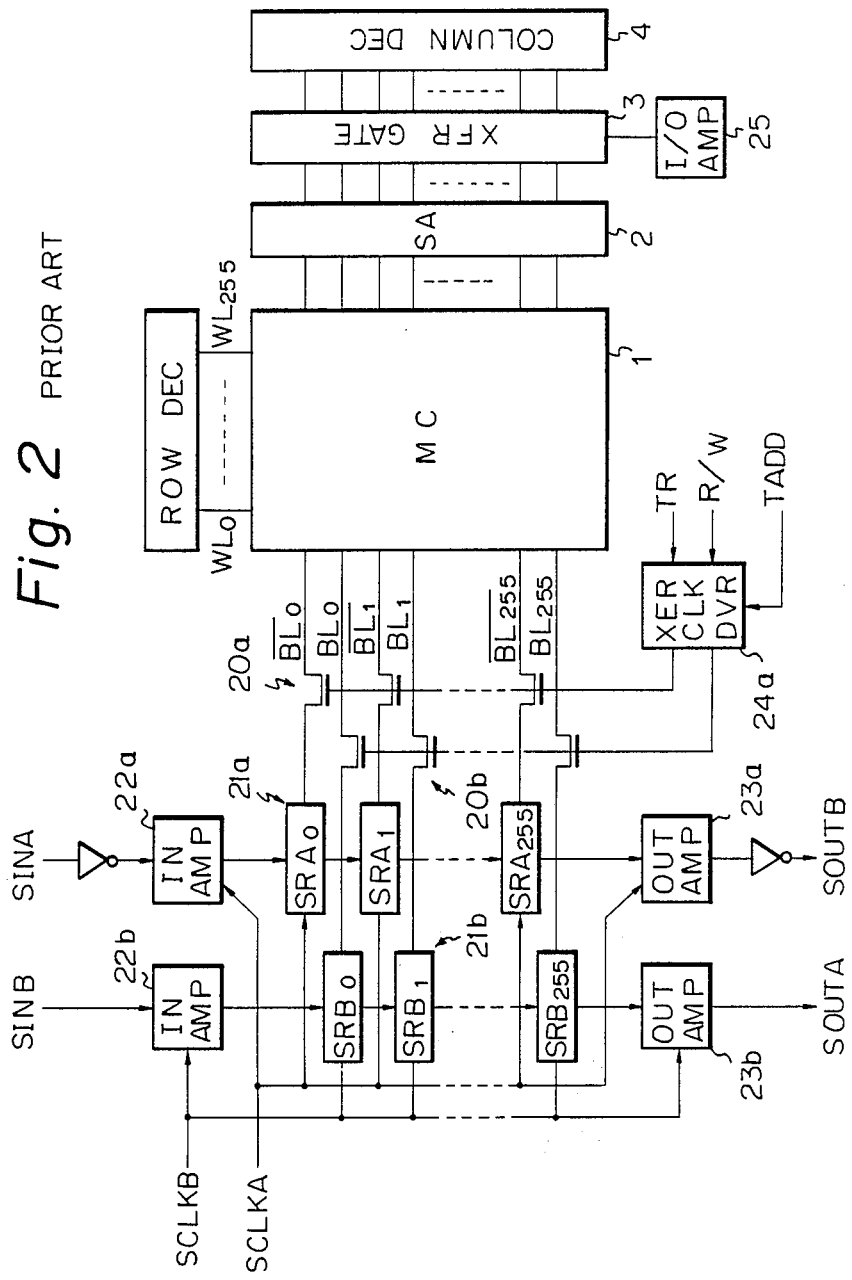
FIG. 2 is a circuit diagram in another prior art semiconductor memory device.

FIG. 2 is a circuit diagram of another prior art semiconductor memory device. The semiconductor memory device shown in FIG. 2 has a shift register side consisting of two transfer gate sets 20a and 20b, each of 256 transfer gates, two shift register sets 21a and 21b, each of 256 shift registers $SRA_0$ to $SRA_{255}$ and $SRB_0$ to $SRB_{255}$, two input amplifiers 22a and 22b, and two output amplifiers 23a and 23b. The semiconductor memory device shown in FIG. 2 increases the serial access speed on the shift register side approximately two times more than that the device shown in FIG. 1 with the same frequency shift clock pulse.

However, the addition of shift registers is disadvantageous when trying to lower the size of the semiconductor memory device. This problem is aggravated in that the shift registers are usually formed in the narrow space near the sense amplifiers and in parallel to the word lines and formation thereof requires a large area, resulting in a large area being occupied on the semiconductor chip. Furthermore, it increases the number of pins.

Preferred embodiments of the present invention will now be described.

Figure 3:
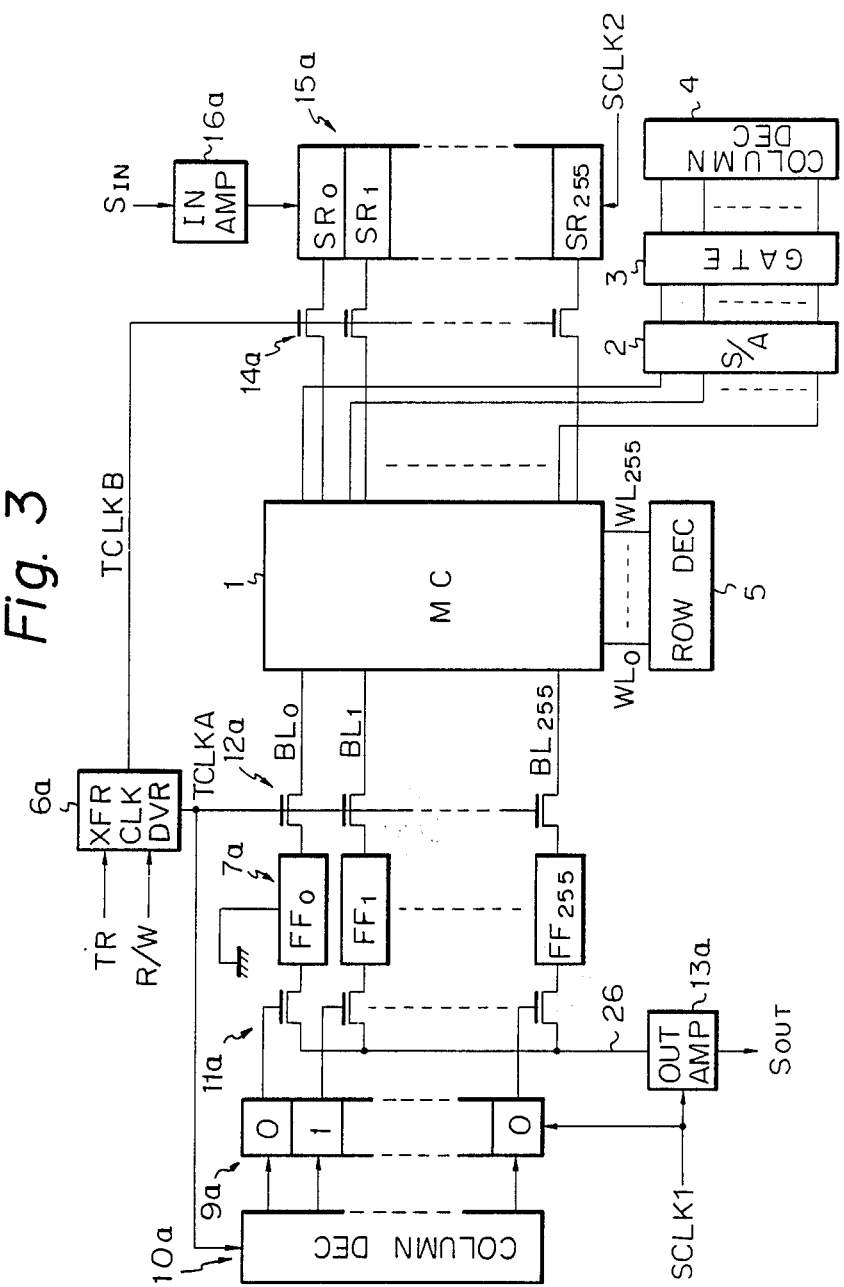
FIG. 3 is a circuit diagram of an embodiment of a semiconductor memory device in accordance with the present invention.

FIG. 3 is a circuit diagram of an embodiment of a semiconductor memory device in accordance with the present invention. In FIG. 3, the semiconductor memory device includes a dynamic RAM cell array 1, a row decoder 5, a sense amplifier set 2, a gate set 3, and a column decoder 4, identical to those in FIGS. 1 and 2. The semiconductor memory device includes, at an input data side, an input transfer gate set 14a, a shift register set 15a, and an input amplifier 16a applied with input data $S_{IN}$. The semiconductor memory device also includes, at an output side, an output transfer gate set 12a, a latch circuit set 7a, an output gate set 11a, a pointer shift register set 9a, a column decoder 10a designating the pointer shift register set 9a, a data bus 26 connected to the output gate set 11a, and an output amplifier 13a connected to the data bus 26. The semiconductor memory device includes a transfer clock driver 6a outputting an A-phase transfer clock signal TCLKA for driving the output transfer gate set 12a and a B-phase transfer clock signal TCLKB for driving the input transfer gate set 14a.

The dynamic RAM cell array 1 is defined by 256 word lines $WL_0$ to $WL_{255}$ and 256 bit lines $BL_0$ to $BL_{255}$. Accordingly, the input transfer gate set 14a consists of 256 gates. The shift register set 15a consists of 256 shift registers $SR_0$ to $SR_{255}$ for storing data to be written into the RAM cell array. The output transfer gate set 12a also consists of 256 gates. The latch circuit set 7a consists of 256 flip-flops $FF_1$ to $FF_{255}$. The output gate set 11a consists of 256 gates. The pointer shift register set 9a consists of 256 pointer registers.

Figure 4:
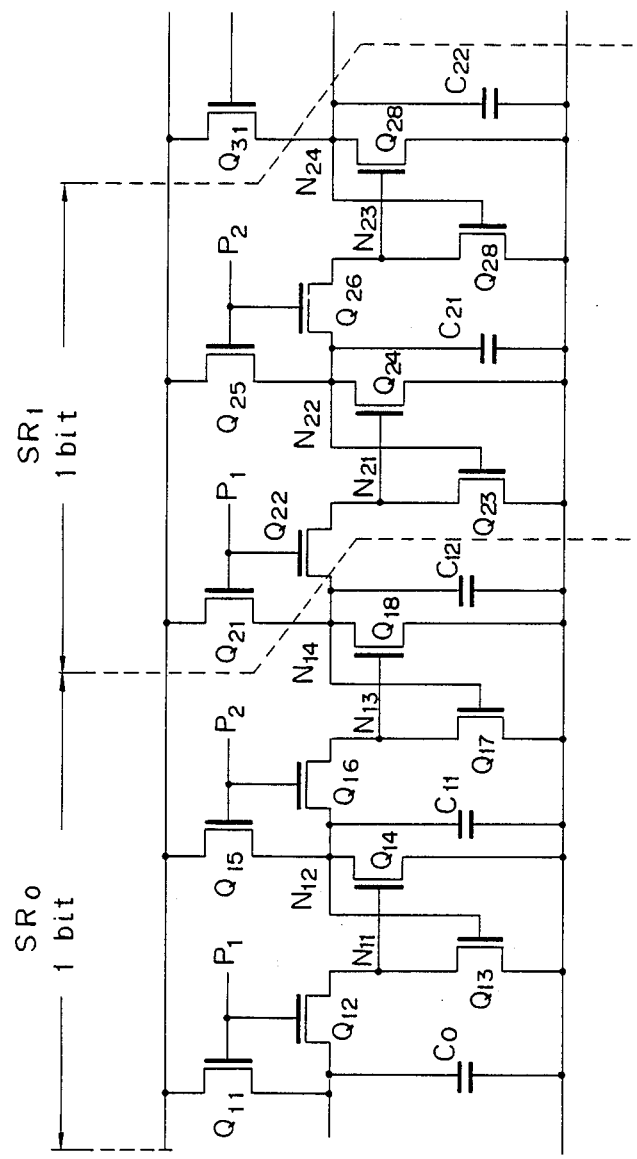
FIG. 4 is a circuit diagram of a part of the shift register set shown in FIG. 3.
Figure 5:
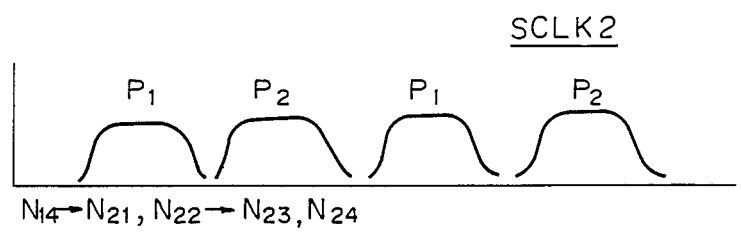
FIG. 5 is a view of waveforms of the clock signal for driving the shift register set shown in FIG. 4.

FIG. 4 is a circuit diagram of a part of one example of the shift register set 15a shown in FIG. 3. The shift registers $SR_0$ and $SR_1$ shown in FIG. 4 are two-phase ratio-type shift registers. FIG. 5 shows waveforms of the clock signal for driving the shift register set 15a of the type as shown in FIG. 4. In a master mode, a value at a node $N_{14}$ in the preceding shift register $SR_0$ is transferred to a node $N_{21}$ in the shift register $SR_1$ by turning transistor $Q_{22}$ ON with a first clock pulse $P_1$. When the level at the node $N_{22}$ is high, i.e., logical "1", the level at a node $N_{22}$ is inverted by turning transistor $Q_{24}$ ON. After that, in a slave mode, by applying a second clock pulse $P_2$ to a base of transistor $Q_{26}$, the transistor $Q_{26}$ is turned ON, with a resultant equal logic level between the nodes $N_{22}$ and $N_{23}$. The level at a node $N_{24}$ is inverted in accordance with the level at the node $N_{23}$. The above successive operation in the shift register may be similarly applied to other shift registers in the shift register set 15a. As a result, one bit is consecutively shifted through the shift register set 15 in response to application of each pair of the clock signals $P_1$ and $P_2$.

Other types of shift registers, for example, a conventional four-phase ratio-less type shift register, may be employed as the shift register set 15a, insofar as the registers are capable of storing and serially shifting data.

Figure 6:
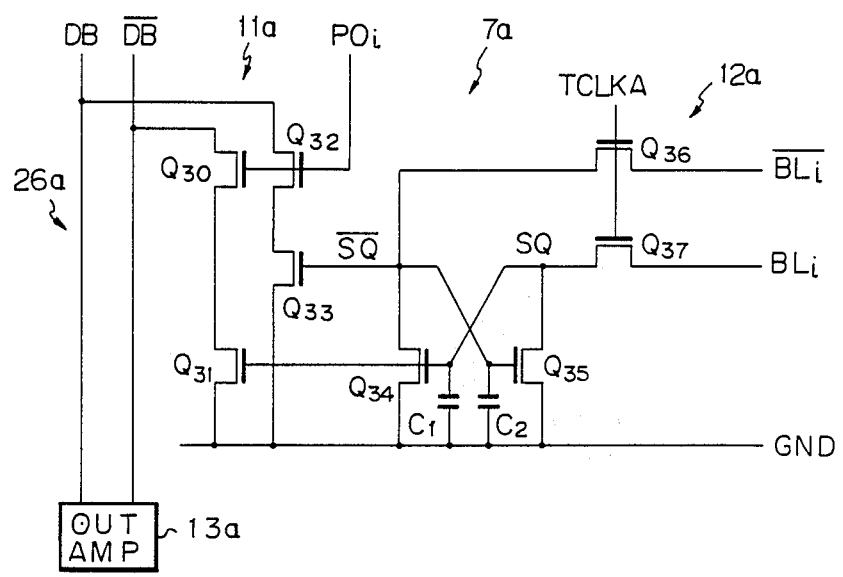
FIGS. 6 to 12 are specific circuit diagrams of circuit units of the latch circuit set shown in FIG. 3.

FIG. 6 is a specific circuit diagram of one circuit unit of the latch or flip-flop circuit set 7a, the output gate set 11a, and the output transfer gate set 12a shown in FIG. 3. In FIG. 6, a pair of complementary bit lines $BL_i$ and $\overline{BL_i}$ correspond to one bit line $BL_i$ in FIG. 3. One gate of the output transfer gate set 12a consists of transistors $Q_{36}$ and $Q_{37}$ connected to the pair of complementary bit lines $BL_i$ and $\overline{BL_i}$ and driven by the A-phase clock signal TCLKA. One gate of the output gate set 11a consists of transistors $Q_{30}$ and $Q_{32}$ connected to the data bus 26 formed by a pair of complementary data buses DB and $\overline{DB}$. One latch circuit of the latch circuit set 7a consists of a pair of transistors $Q_{34}$ and $Q_{35}$ and a pair of capacitors $C_1$ and $C_2$ forming a flip-flop circuit. The capacitors $C_1$ and $C_2$ may be formed from the gate parasitic capacitances of the transistors $Q_{34}$ and $Q_{35}$. Transistors $Q_{31}$ and $Q_{33}$ are buffer transistors for connecting outputs at nodes SQ and $\overline{SQ}$ of the flip-flop to the data bus 26.

The operation of the circuits shown in FIG. 6 is as follows: (a) by applying the clock signal TCLKA, the transistors $Q_{36}$ and $Q_{37}$ are turned ON in a short period to introduce signals on the bit lines $BL_i$ and $\overline{BL_i}$ to the nodes SQ and $\overline{SQ}$, (b) in accordance with signal levels at the nodes SQ and $\overline{SQ}$, the flip-flop 7a is set or reset and maintains its state and, at the same time, the buffer transistors $Q_{33}$ and $Q_{31}$ are turned ON or OFF in response to the signal level at the nodes SQ and $\overline{SQ}$, and (c) by applying a pointer command or signal $PO_i$ from one pointer shift register in the pointer register set 9a, the gate transistors $Q_{32}$ and $Q_{30}$ are turned ON in a short period to output the signals at the nodes SQ and $\overline{SQ}$ in the flip-flop to the pair of data buses DB and $\overline{DB}$, with a resultant read-out of a differential voltage between the data buses DB and $\overline{DB}$ at the output amplifier 13a.

Figure 7:
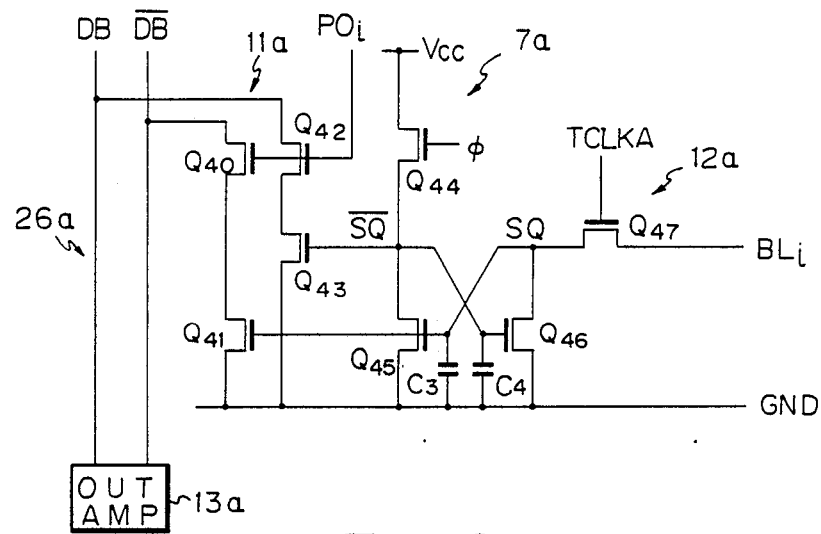

FIG. 7 is another specific circuit diagram of a circuit unit, corresponding to that shown in FIG. 6. In FIG. 7, one bit line $BL_i$ is used. Accordingly, the gate of the output transfer gate set 12a consists of only one transistor $Q_{47}$. The gate of the output gate set 11a consists of transistors $Q_{40}$ and $Q_{42}$. The flip-flop circuit 7a includes a charge-up transistor $Q_{44}$ in addition to the flip-flop circuit shown in FIG. 6. The transistors $Q_{45}$ and $Q_{46}$, capacitors $C_3$ and $C_4$, and buffer transistors $Q_{41}$ and $Q_{43}$ correspond to the transistors $Q_{34}$ and $Q_{35}$, the capacitors $C_1$ and $C_2$, and the buffer transistors $Q_{31}$ and $Q_{33}$. The charge-up transistor $Q_{44}$ is operable to reset the state of the flip-flop circuit upon receipt of a clock signal $\phi$, prior to introduction of the signal on the bit line $BL_i$ to the node in the flip-flop circuit. That is, by applying the clock signal $\phi$, having a short ON state, to the transistor $Q_{44}$, the transistor $Q_{44}$ is turned ON to bring the node $\overline{SQ}$ to the high level and thus to turn a transistor $Q_{46}$ ON, resulting in the node SQ indicating the reset state of the flip-flop becoming a low level. After that, when the signal introduced at the node SQ through the transistor $Q_{47}$ is high, a transistor $Q_{45}$ is turned ON to change the node $\overline{SQ}$ to the low level, turning the transistor $Q_{46}$ OFF. The signal level at the node SQ is maintained at the high level. Other operations of the circuits shown in FIG. 7 are similar to those of the circuits shown in FIG. 6, and thus are not described.

Figure 8:
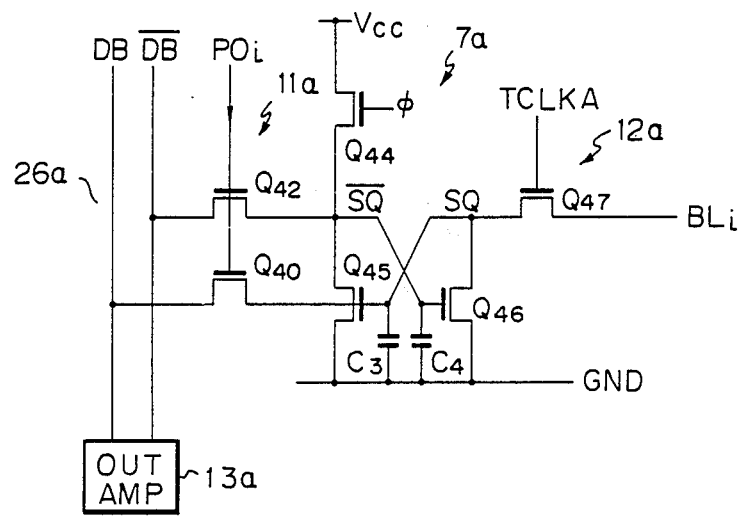

FIG. 8 is still another specific circuit diagram of a circuit unit, corresponding to that shown in FIG. 6. In the circuit shown in FIG. 8, the buffer transistors $Q_{41}$ and $Q_{43}$ in the circuit shown in FIG. 7 are eliminated, making the circuit simpler than that of FIG. 7.

In FIGS. 6 to 8, the complementary pair of data buses DB and $\overline{DB}$ are provided, resulting in a high-speed data read and improving the reliability of data read due to detection of the differential voltage between the data buses DB and $\overline{DB}$.

Figure 9:
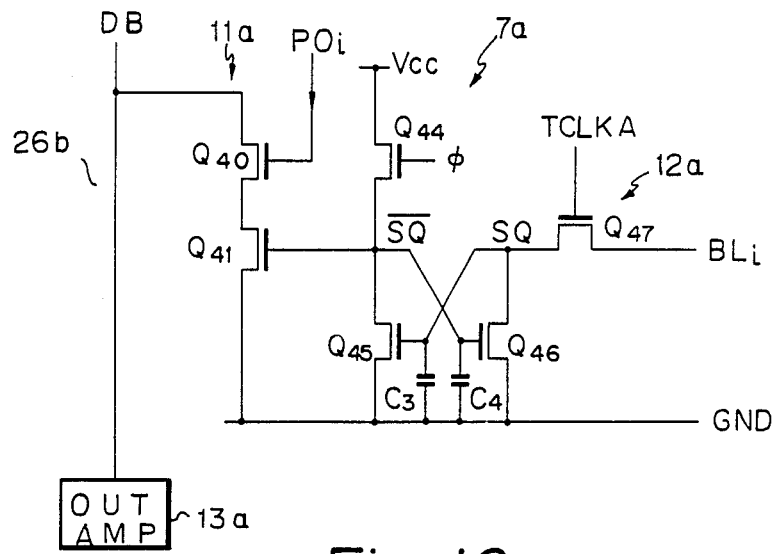

FIG. 9 is another specific circuit diagram of a circuit unit, corresponding to that shown in FIG. 7. In the circuit shown in FIG. 9, the data bus 26 consists of a data bus DB. The gate transistors $Q_{42}$ and $Q_{43}$ shown in FIG. 7 are omitted, resulting in a simplified circuit configuration.

The circuits shown in FIGS. 6 to 9 provide high speed data read and low power consumption.

Figure 10:
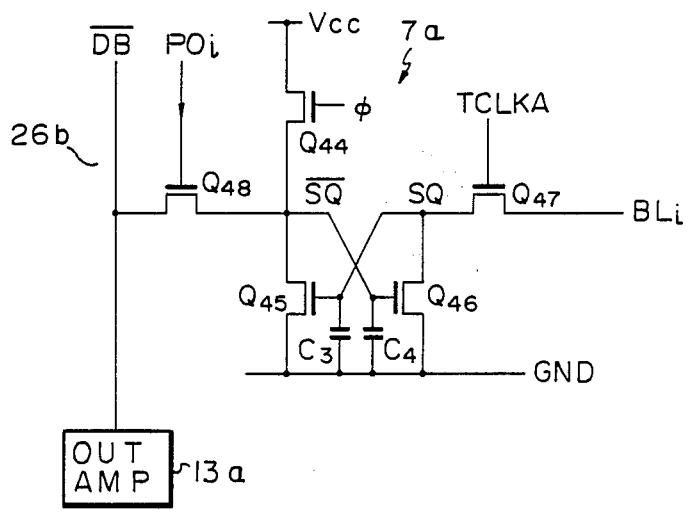

FIG. 10 is still another modification of FIG. 6.

The circuits shown in FIGS. 6, 7 and 9 perform non-destructive data read from the latch circuit 7a at a high speed by discharging the data bus 26 in accordance with the latched data by triggering the output gate 11a in response to the pointer command or signal $PO_i$. Since the long period for data latch in the latch circuit 7a is usually not necessary in most of the practical application of the high speed serial read mode, a short-period read and rewrite operation, i.e., a refresh operation as practiced in dynamic RAM devices, is usually not necessary. However, many modifications of the latch circuit 7a are possible in order to make the refresh operation for the long period of data latch unnecessary.

One modification is to provide high impedance loads, such as non-doped polysilicon resistors, as pull-up circuit elements connected between the power source $V_{CC}$ and each of the node SQ and $\overline{SQ}$.

Another modification is to provide a conventional charge pump circuit connected to the nodes SQ and $\overline{SQ}$. In general, an oscillator is provided in the semiconductor memory device to generate a pumping clock, which is asynchronous to the internal clocks, supplied to the circuit for charge pumping the latch circuit. The generation of the pumping clock may be substituted for by division of a system clock signal SCLK (not shown) supplied to the semiconductor memory device shown in FIG. 3. The read refresh operation may be carried out in the circuits of FIGS. 8 and 10 which perform destructive data read.

Figure 11:
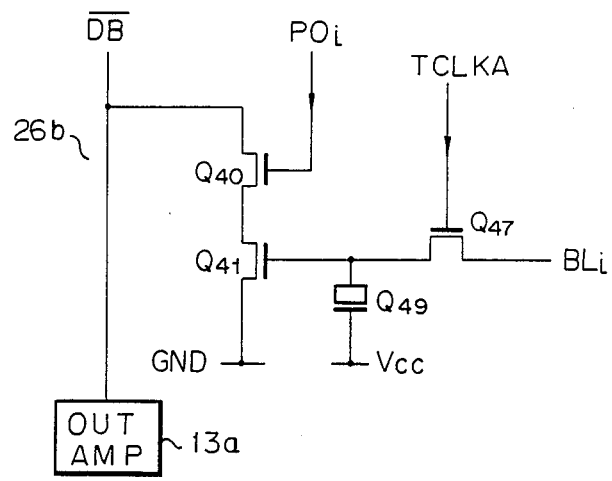
Figure 12:
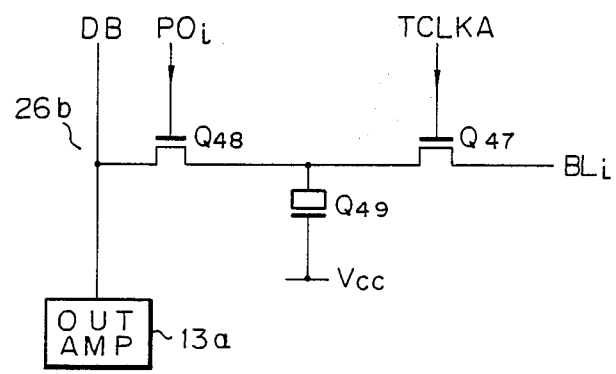

Clearly, the essential function of the latch circuit set 7a is just to temporarily hold the logic signal level on the bit lines. FIGS. 11 and 12 are more simplified circuit diagrams corresponding to those shown in FIGS. 9 and 10. In FIGS. 11 and 12, a metal oxide semiconductor type capacitor $Q_{49}$ is formed instead of the latch circuit set, all of these circuits temporarily hold bit line logic signal levels.

FIG. 13 is a circuit diagram of a part of the pointer shift register set 9a. The n-th pointer shift register $PSR_n$ consists of a depletion-type transistor $Q_{56}$ and enhancement-type transistors $Q_{57}$ and $Q_{60}$ to $Q_{65}$. Other pointer shift registers are constructed in the same way. FIG. 14 is a view of waveforms of the clock signal SCLK1 for driving the pointer shift register set 9a. A clock pulse signal SCLK1 shown in FIG. 3 for driving the pointer shift registers includes a first pulse PE and a second pulse NPE, which are phase-shifted by 180° from each other. The outputs $SL_0$ to $SL_{255}$ of this pointer shift register set 9a are applied to the output gate set 11a as the pointer commands or signals $PQ_0$ to $PO_{255}$, respectively.

The operation of the pointer shift registers will now be described. First, when the pulse PE is a high level, it is assumed that an output $SL_{n-1}$ at the (n−1)-th pointer shift register $PSR_{n-1}$ is a high level or logical "1" and all other outputs $SL_0$ to $SL_n$ and $SL_{n-2}$, $SL_{n+1}$ to $SL_{255}$ are a low level or logical "0". Due to application of high level voltage of the output $SL_{n-1}$, the transistor $Q_{64}$ in the n-th pointer shift register $PSR_n$ is turned ON, with a resultant charge-up of a node $SP_n$ to the high level. By applying a high level signal at the node $SP_n$ to a gate of transistor $Q_{75}$ in the pointer shift register $PSR_{n-1}$, the transistor $Q_{75}$ is turned ON, resulting in a low level at the node $SP_{n-1}$. The states at the node $SP_n$ and $SP_{n-1}$ are maintained as is when the pulse PE becomes low. When the pulse NPE becomes high, the transistors $Q_{62}$ and $Q_{72}$ are turned ON, applying a high level signal at the node $SP_n$ to a gate of the transistor $Q_{60}$ and a low level signal at the node $SP_{n-1}$ to a gate of the transistor $Q_{70}$. The signals applied to the respective gates of the transistors $Q_{60}$ and $Q_{70}$ are maintained if the pulse NPE becomes low. Again, applying a pulse PE having a high level to the pointer shift registers $PSR_n$ and $PSR_{n-1}$, the signal levels at nodes $SL_n$ and $SL_{n-1}$ are respectively rendered high and low. As a result, unique "1" bit information is transferred from the pointer shift register $PSR_{n-1}$ to the adjacent pointer shift register $PSR_n$.

The transistors $Q_{73A}$ and $Q_{73B}$ prevent the application of high voltage to a gate of the transistor $Q_{70}$ to securely maintain the node $SL_{n-1}$ at the low level. When the gate of the transistor $Q_{60}$ is supplied with a sufficiently high voltage, the gate voltage of the transistor $Q_{63B}$ is rapidly rendered to the low level together with a change of the node $SL_n$ to high.

The transistors $Q_{56}$, $Q_{57}$, and $Q_{61}$ in the pointer shift register $PSR_n$ and the transistors $Q_{66}$, $Q_{67}$, and $Q_{71}$ are used for preventing malfunctions which may arise due to the floating signal level, i.e., low level, because many nodes $SL_i$ are low level. The depletion transistors $Q_{56}$ and $Q_{66}$ may be replaced by resistors.

Applying one clock signal SCLK1 consisting of the pair of pulses PE and NPE to the pointer shift register set 9a, the 1 bit held in one pointer shift register is transferred to the next pointer shift register and that one pointer shift register is reset. This is successively effected in response to application of the clock signal SCLK1. The pointer command $PO_i$, which is the output $SL_i$ in one pointer shift register $PSR_i$, is supplied to the corresponding gate in the output gate set 11a, as shown in FIGS. 6 to 12, to read the data stored in the corresponding latch circuit 7a at the output amplifier 13a. This read operation can be successively effected in response to the shift of the "1" bit in the pointer shift register set 9a.

The pointer shift register circuit shown in FIG. 13 features a unique "1" bit shift therein for achieving simple control, low power consumption, and somewhat faster transfer speed.

The pointer shift register circuit may be connected as a ring transfer pointer register circuit by connecting the nodes $SL_0$ to $SL_{255}$ and the nodes $SP_0$ to $SP_{255}$, for ring-shifting the unique "1" bit therein.

The column decoder 10a shown in FIG. 3 sets the "1" bit in a desired pointer shift register $PSR_i$ for designating start data for read-out on the desired bit line $BL_i$. When the start address for read-out is always fixed at a certain address, the column decoder 10a can be removed.

If a data read is required for the memory cells in an area within the word lines $WL_{j1}$ to $WL_{j2}$ and the bit lines $BL_{i1}$ to $BL_{i2}$, first, the word line $WL_{j1}$ is selected by the row decoder 5 and all data on the word line $WL_{j1}$ are transferred in parallel to the latch circuit set 7a through the transfer gate set 12a. The column decoder 10a sets the "1" into the i1-th pointer shift register to start read out from the i1-th latch circuit 7a. The shift operation of the "1" in the pointer shift registers terminates when the "1" bit is transferred to the i2-th pointer shift register. In this way, the data read-out operation for the word line $WL_{j1}$ and the bit lines $BL_{i1}$ to $BL_{i2}$ is performed. Similar operations proceed for subsequent word lines $WL_{j1+1}$ to $WL_{j2}$.

The serial data input operation will now be described.

Referring to FIGS. 3 and 4, the input data $S_{IN}$ including the serial 256 bits of data is successively supplied to the first shift register $SR_0$ in the shift register set 15a through the input amplifier 16a. Upon loading the 256 serial bits into the shift register set 15a, the loaded data is stored as a group in the dynamic RAM cells selected by the word line through the input transfer gate set 14a. This operation is similar to that of the prior art. The provision of only one input amplifier 16a and the connection of the input amplifier 16a to the first shift register $SR_0$ would, on the one hand, limit the flexibility of data input, but, on the other hand, result in a simpler circuit configuration.

In processing image data, a variety of data store methods may be required.

One method is high-speed-all-memory-cell-set to "0" (clear) or "1". In the high-speed-all-memory-cell-clear operation, first, the shift register set 15a is reset, and the zero bits in the shift registers are stored in the dynamic RAM cells between the word line $WL_0$ to $WL_{255}$.

Another data store method uses data setting at pivots in the memory cell array as shown in FIGS. 15a and 16a. FIG. 15a shows a schematic memory cell array wherein only pivotal memory cells are set to "1". FIG. 16a shows a schematic memory cell array wherein pivotal and adjacent memory cells are set to "1". FIGS. 15b to 15d represent operations of the shift registers for carrying out the data set shown in FIG. 15a. In FIG. 15b, first, the first shift register $SR_0$ is set, and the other shift registers $SR_1$ to $SR_{255}$ are reset. The data series "10 ... 0" in the shift registers $SR_0$ to $SR_{255}$ is stored in the memory cells selected by the first word line $WL_0$. In FIG. 15c, the "1" bit is shifted to the shift register $SR_1$ by applying the "0" bit to the shift register $SR_0$, and the data series "010 ... 0" is stored in the memory cells selected by the second word line $WL_1$. The above-mentioned operation is repeated. In FIG. 15d, the "1" bit is shifted to the shift register $SR_{255}$, and the data series "00 ... 01" is stored in the memory cells selected by the last word line $WL_{255}$.

In order to realize the above data store shown in FIG. 15a, the shift register set 15a, which is shown in FIG. 4, can be replaced by the register series shown in FIG. 13, which is operable for the pointer shift register set 9a.

The operations shown in FIGS. 16b to 16e are similar to those shown in FIGS. 15b to 15d. In FIGS. 16b to 16e, two bits "11" are shifted in the shift register set 15a.

In the above-mentioned embodiments, different circuit configurations were formed from the viewpoint of different roles of the data input side and the data output side and in order to simplify the circuit.

Figure 17:
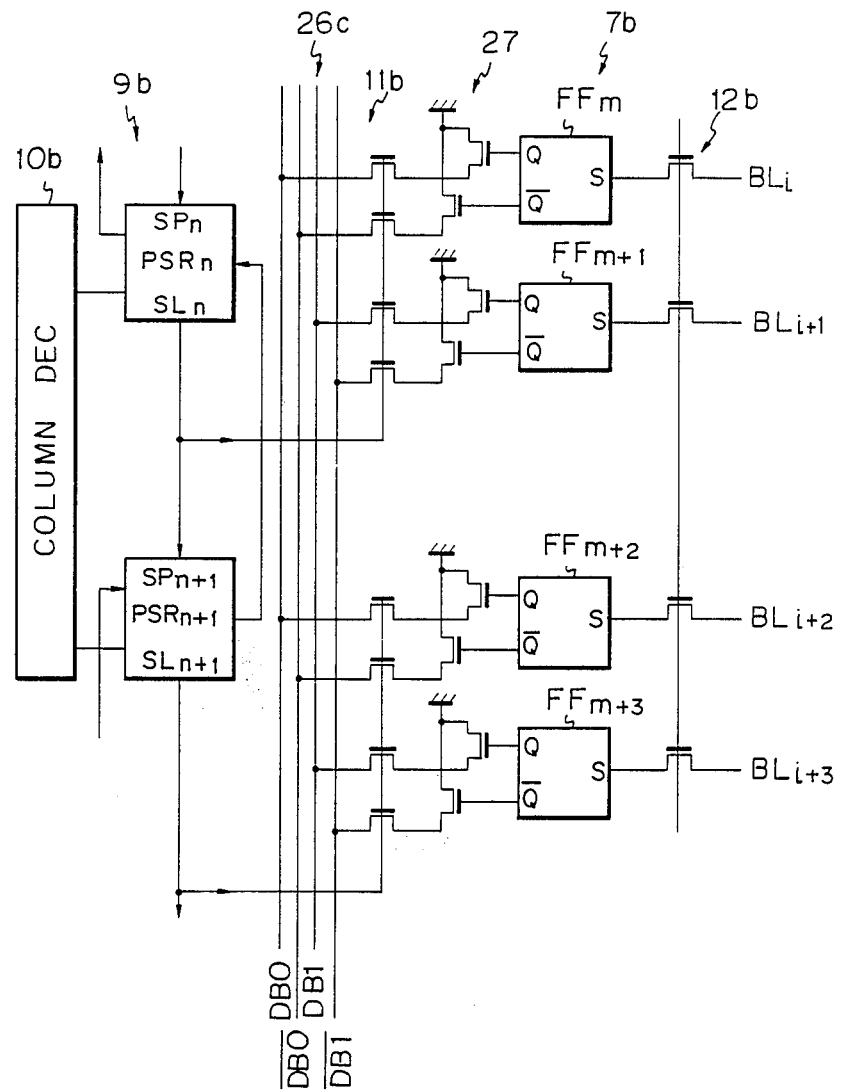
FIG. 17 is a circuit diagram of another embodiment of a semiconductor memory device in accordance with the present invention.

FIG. 17 is a circuit diagram of another embodiment of a semiconductor memory device in accordance with the present invention. The semiconductor memory device has double data read-out lines. In FIG. 17, only part of the data read-out lines are illustrated and other portions are omitted.

In FIG. 17, the semiconductor memory device includes a data bus unit 26C consisting of two pairs of complementary data bus lines $DB_0$ and $\overline{DB_0}$ and $DB_1$ and $\overline{DB_1}$ and flip-flops 7b ($FF_m$ to $FF_{m+1}$), a set terminal S of each of which are operated connected to the corresponding bit line BL through the output transfer gate set 12a, complementary output terminals Q and $\overline{Q}$ of each of which are operatively connected to one pair of the data bus lines $DB_0$ and $\overline{DB_0}$ or $DB_1$ and $\overline{DB_1}$ through an output gate set 11b and gates 27 connected between the output gates of the output gate set 11b and the output terminals Q and $\overline{Q}$. The semiconductor memory device further includes a pointer shift register set 9b and two output amplifiers (not shown) connected to each pair of data bus lines $DB_0$ and $\overline{DB_0}$ and $DB_1$ and $\overline{DB_1}$. The differential voltage between the output terminals Q and $\overline{Q}$ of the flip-flop is detected at the output amplifier. In the semiconductor memory device, double output gates 11b for each flip-flop 7b, additional bus lines $DB_1$ and $\overline{DB_1}$, and an additional output amplifier are added as compared with the semiconductor memory device shown in FIG. 3. On the other hand, one pointer shift register PSR activates to turn ON two pairs of output gates 11b connected to two flip-flops $FF_m$ and $FF_{m+1}$ or $FF_{m+2}$ and $FF_{m+3}$. Thus, the number of the pointer shift registers is reduced by half compared with the pointer shift registers shown in FIG. 3. This together, enables simplification of the read-out circuit of the semiconductor memory device. More particularly, the data read-out time is improved to half that of the semiconductor memory device shown in FIG. 3, since the independent double read-out systems are provided.

Clearly, the circuit constructions shown in FIGS. 6 to 8 may be applied to the semiconductor memory device shown in FIG. 17.

Figure 18A:
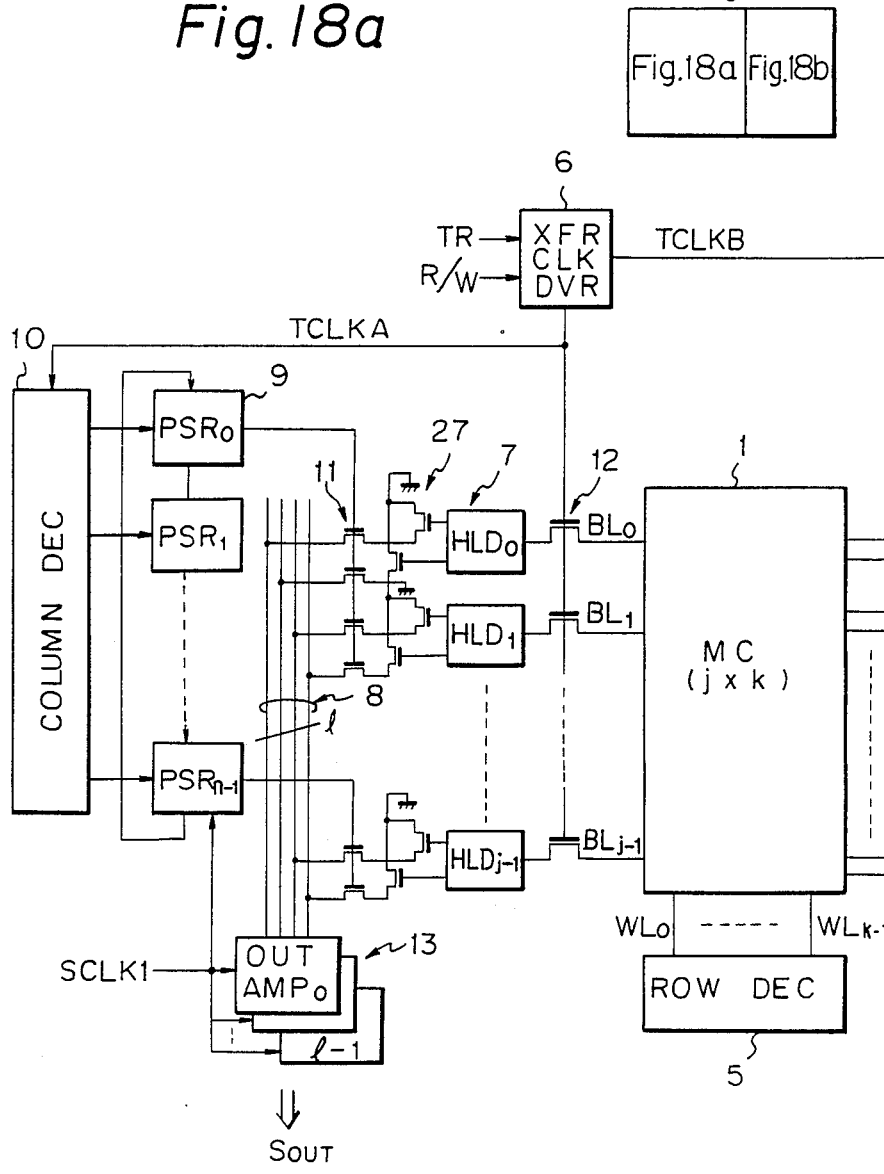
FIGS. 18a and 18b show a circuit diagram of yet another embodiment of a semiconductor memory device in accordance with the present invention.
Figure 18B:
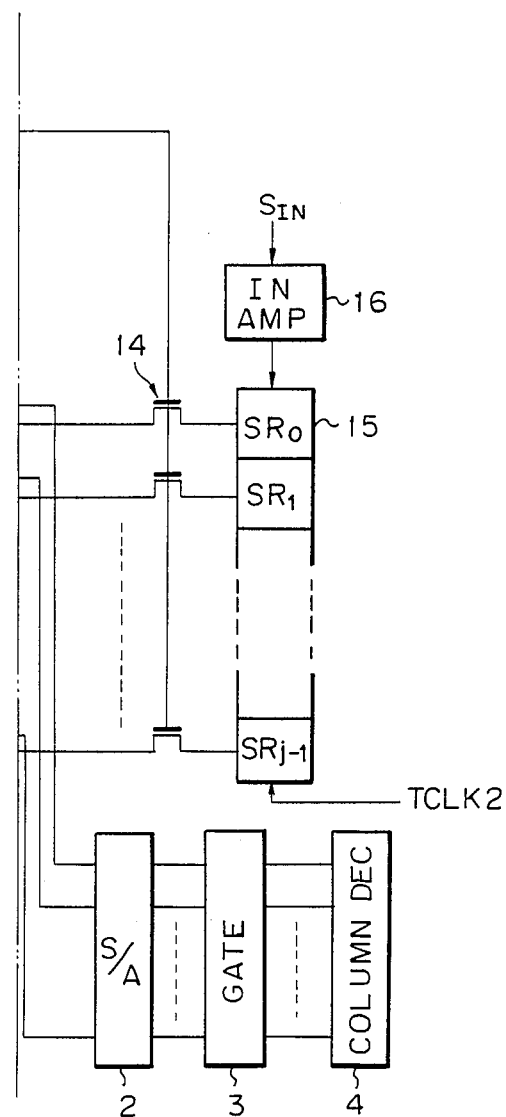

FIGS. 18a and 18b show a circuit diagram of yet another embodiment of a semiconductor memory device in accordance with the present invention.

In FIGS. 18a and 18b the semiconductor memory device includes a memory cell array 1 having a plurality of memory cells arranged in a matrix with a plurality of (j) bit lines BL and a plurality of (k) word lines WL, an input transfer gate set 14 consisting of j transfer gates, and a shift register set 15 consisting of j shift registers $SR_0$ to $SR_{j-1}$. The semiconductor memory device also includes an output transfer gate set 12 consisting of j transfer gates, a latch circuit set 7 consisting of j hold circuits, 2×j buffer gates 27, an output gate set 11 consisting of 2×j gates, a data bus unit 8 consisting of a plurality of (l, where l is positive and power of 2, e.g., 1, 2, 4, ...) pairs of data bus lines, l output amplifiers 13, and a pointer shift register set 9 consisting of a plurality of (j/l) pointer shift registers. Other circuit elements 2, 3, 4, 5, 6, 10, and 16 are identical to those in FIG. 3.

Each of the hold circuits of the latch circuit set 7 may be a flip-flop shown in FIGS. 6 to 10, a capacitor shown in FIGS. 11 and 12, or the like.

By providing l pairs of data bus lines, each pair of data bus lines being shown in FIGS. 6 to 8, or l data bus lines, each data bus line being shown in FIGS. 9 to 12, the read-out time may be reduced to 1/l or the shift cycle for driving the pointer shift registers may be reduced to 1/l with the same read-out time. The latter will contribute to lower power consumption. Also, by reducing the number of the pointer shift registers to j/l, the power consumption in the pointer shift register set, which is considerably larger than that in the latch circuit set 7, is greatly reduced. In addition, the area occupied by the pointer shift register set 9, which is larger than that of the latch circuit set 7 due to its greater complexity, is also reduced.

In the above embodiments, one object was to simplify the circuit on the data input side and to reduce the power consumption therein. Therefore, the data input side was realized by the shift registers shown in FIG. 4, which are low in speed but also low in power consumption. Clearly, high-speed shift registers may be used for the semiconductor memory device. Also, a plurality of shift register sets may be used. In contrast, if high-speed data store is not required, the normal data input (store) circuit of the memory device may be used for data store and, thus, the data input side, consisting of the input transfer gate set 14, the shift register set 15, and the input amplifier 16, may be eliminated.

Figure 19:
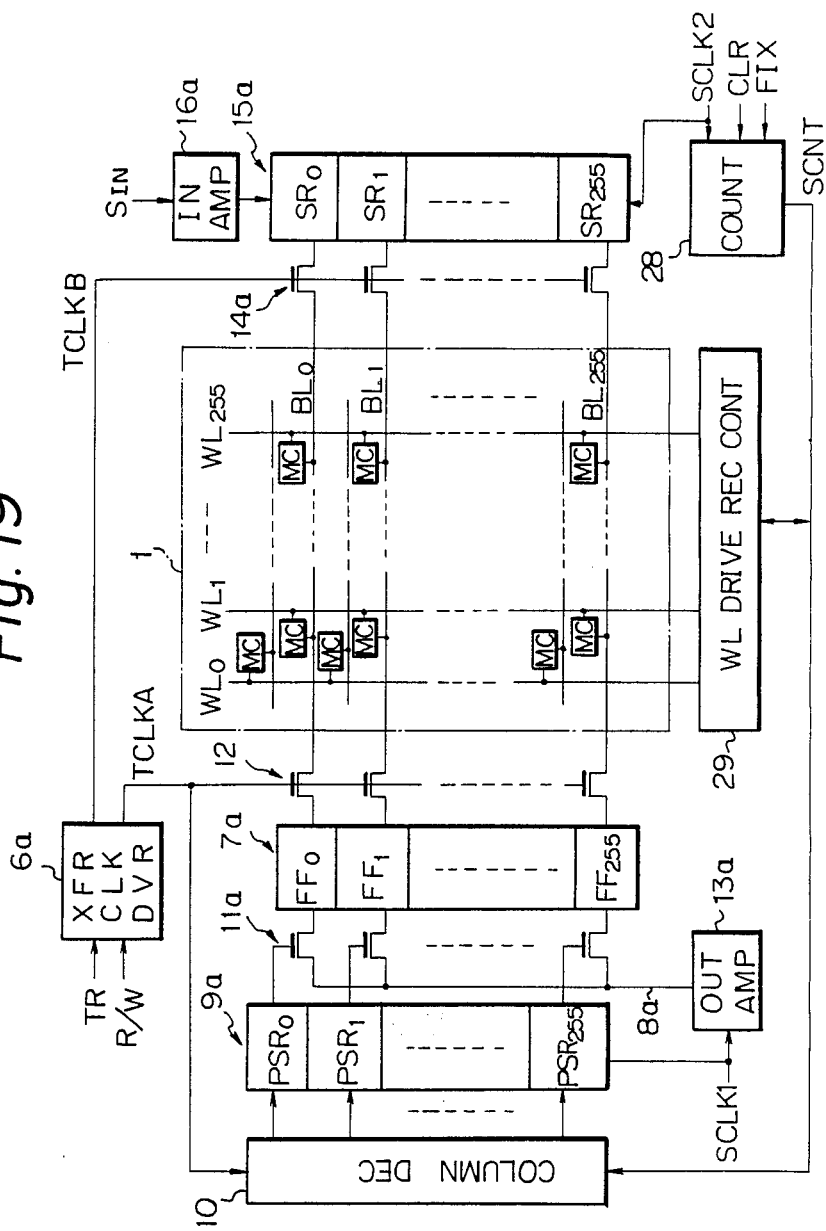
FIG. 19 is a circuit diagram of a further embodiment of a semiconductor memory device in accordance with the present invention, operable for FIFO processing.

FIG. 19 is a circuit diagram of a further embodiment of a semiconductor memory device in accordance with the present invention.

In FIG. 19, the semiconductor memory device includes a counter 28, which receives the clock signal SCLK2, a clear signal CLR, and a fixing signal FIX and outputs a counted value $S_{CNT}$ to the column decoder 10, and a word line drive record control circuit 29, in addition to the elements of the semiconductor memory device shown in FIG. 3. By providing the counter 28, the semiconductor memory device shown in FIG. 19 can be operated with FIFO data.

The operation of the semiconductor memory device shown in FIG. 19 will now be explained.

First, the clear signal CLR is supplied to the counter 28, clearing the counter 28. The shift register set 15 may be cleared, if required.

Second, the input data $S_{IN}$ is continuously supplied to the first shift register $SR_0$ and is shifted in the shift register set 16 in synchronization with the clock signal SCLK2. At the same time, the counter 28 counts the clock signal SCLK2 indicating the shifted number in the shift register set 15. When eight bits of data of the input data $S_{IN}$ are supplied to the shift register set 15, the counter 28 counts eight, and the counted value $S_{CNT}=8$. Upon completion of the shift, the counted value $S_{CNT}$ is fixed by the fixing signal FIX. The shift registers $SR_0$ to $SR_7$ store the input data $S_{IN}$, and the shift registers $SR_8$ to $SR_{255}$ are cleared.

Third, when the transfer request signal TR=1 and the read/write signal R/W=1 indicating the store request are supplied to the transfer clock driver 6a, the input transfer gate set 14a is turned ON by the clock signal TCLKB, storing the data stored in the shift register set 15 in the memory cell array 1 designated by the word line WL.

Fourth, when the transfer request signal TR=1 and the read/write signal R/W=0 indicating the read-out request is supplied to the transfer clock driven 6a, the output transfer gate set 7 is turned ON by the clock signal TCLKA, reading out the data just stored in the memory cell array 1 into the latch circuit set 7.

After that, the counted value $S_{CNT}$, which is 8, is supplied to the column decoder 10, setting "1" in the eight pointer shift register $PSR_7$ in the pointer shift register set 9a. Accordingly, the eighth gate in the output gate set 11a is turned ON by the pointer shift register $PSR_7$, whereby the content stored in the eighth flip-flop $FF_7$ in the latch circuit set 7a is read-out by the output amplifier 13a.

Upon completion of data read-out, the column decoder 10 decrements the number designating the pointer shift register set 9a, and the adjacent smaller number the flip-flop $FF_6$ is read-out. This is continued until the flip-flop $FF_0$ is read-out.

From the above description, it will be understood that a FIFO operation for one word line is achieved.

In order to expand the FIFO operation for a plurality of word lines, the word line drive record controller 29 is provided. The word line drive record controller 29 records the sequence of the selected word lines when the data store operaton is effected under the FIFO operation mode. Upon completion of the data store operation, in the data read-out mode, the word line drive record controller 29 continuously selects the word lines in order of the recorded sequence. The data store and data read-out operations are similar to those mentioned above. The column decoder 10 initiates the pointer shift register set 9a before each data-read-out operation.

When the shift numbers of the input data $S_{IN}$ in the shift register set 15a are different for each data store operation, the counter 28 stores the respective shift numbers and outputs the stored shift numbers in response to the sequence of the word line selection.

Clearly, the circuits shown in FIGS. 4 to 18 may be applied to the semiconductor memory device shown in FIG. 19, and vice-versa.

Although only serial access circuits are specifically described in the above embodiments, a random access means for operating independently of the serial access circuits may advantageously be provided as in the prior art devices of FIGS. 1 and 2.

In the above embodiments, the memory cell array 1 was a dynamic RAM type, however, it may also be of the static RAM type.

Many widely different embodiments of the present invention may be constructed without departing from the spirit and scope of the present invention. It should be understood that the present invention is not limited to the specific embodiments described in this specification, except as defined in the appended claims.

I claim:

1. A semiconductor memory device, comprising:
   a memory cell array including a plurality of memory cells arranged in a matrix and having a plurality of bit lines and a plurality of word lines;
   a serial data input circuit operatively connected to said memory cell array and including:
   at least one shift register set, each having a plurality of shift registers and consecutively storing serial input data applied from an external circuit; and
   at least one first gate set, each having a plurality of gates for simultaneously connecting said plurality of shift registers of said at least one shift register set and said plurality of bit lines to store simultaneously said serial input data, stored in said plurality of shift registers, into memory cells selected by one of said word lines; and
   a serial data output circuit operatively connected to said memory cell array and including:
   at least one data bus;
   at least one data holding circuit set, each having a plurality of data holding circuits and corresponding outputs, an input of each being operatively connectable to said corresponding bit lines through a corresponding one of said gates of said at least one second gate set;
   at least one third gate set, each having a plurality of gates provided between the outputs of said plurality of said at least one data holding circuit and the at least one data bus and for outputting data held in said at least one data holding circuit to said at least one data bus; and
   data output means having a gate driving circuit for selectively driving one of said gates in said at least one third gate set, said plurality of gates of said at least one second gate set being simultaneously operated to transfer a plurality of data on a selected word line into said at least one data holding circuit set, and said data held in said at least one data holding circuit set being output to said at least one data holding circuit set being output to said at least one data bus in response to the operation of said at least one third gate set.

2. A semiconductor memory device according to claim 1, wherein each of said plurality of data holding circuits in each at least one data holding circuit set includes a capacitive element for holding data.

3. A semiconductor memory device according to claim 1, wherein each of said shift registers of said at least one shift register set in said serial data input circuit comprises a two-phase ratio-type shift register.

4. A semiconductor memory device according to claim 1, further comprising counting means, operatively connected to said shift register set and said data output means, for counting the number of inputs of said serial input data into said shift register set and outputting the counted value to said data output means, said gate driving circuit driving one of said gates in said at least one third gate set in response to said counted value to readout data stored in the memory cells through said at least one shift register set.

5. A semiconductor memory device according to claim 4, further comprising recording means, operatively connected to said counting means and said data output means, for recording a sequence of selected word lines during the data store operation from said serial data input circuit and selecting said word lines in response to said sequence of selected word lines during the data read operation by said serial data output circuit, said counting means counting during said data store operation and outputting the counted value to said data output means, and said gate driving circuit performing said driving in response to each word line selection by said recording means.

6. A semiconductor memory device according to claim 1, wherein each of said plurality of data holding circuits in each said at least one data holding circuit set includes a flip-flop.

7. A semiconductor memory device according to claim 6, wherein one output of each flip-flop of said data holding circuit is operatively connected to the data bus through said gate in said at least one third gate set.

8. A semiconductor memory device according to claim 6, wherein said data bus include a pair of bus lines and complementary outputs of each flip-flop of said data holding circuit are operatively connected to the pair of data bus lines of said data buses through said gates in said at least one third gate set.

9. A semiconductor memory device according to claim 1, wherein said gate driving circuit in said data output means includes a plurality of shift registers, said data held in said at least one holding circuit set being output on said at least one data bus through said at least one third gate set in response to the operation of said shift registers of said gate driving circuit.

10. A semiconductor memory device according to claim 9, wherein said at least one data bus includes l data bus lines, "l" being a positive number integer and a power of 2 and wherein said gate driving circuit includes j/l shift registers, "j" being an integer number of said bit lines.

11. A semiconductor memory device according to claim 10, wherein said plurality of shift registers in said gate driving circuit shift only one bit therein in response to a clock signal, the one bit being set in a desired shift register by said data output means.

12. A semiconductor memory device according to claim 11, wherein each of said plurality of data holding circuits in each of said at least one data holding circuit set includes a capacitive element for holding data.

13. A semiconductor memory device according to claim 11, wherein each of said plurality of data holding circuits in each said at least one data holding circuit set includes a flip-flop.

14. A semiconductor memory device according to claim 13, wherein one output of each flip-flop of said data holding circuit is operatively connected to the data bus through said gate in said at least one third gate set.

15. A semiconductor memory device according to claim 13, wherein said data bus includes a pair of bus lines and complementary outputs of each flip-flop of said data holding circuit are operatively connected to the pair of data bus lines of said data bus through said gates in said at least one third gate set.

* * * * *